United States Patent
Tahara et al.

(10) Patent No.: US 9,408,296 B2
(45) Date of Patent: Aug. 2, 2016

(54) RESIN COMPOSITION, AND PROTECTIVE FILM, DRY FILM, CIRCUIT BOARD, AND MULTILAYER CIRCUIT BOARD CONTAINING SAME

(75) Inventors: Shuji Tahara, Ichihara (JP); Kiyomi Yasuda, Ichihara (JP)

(73) Assignee: Mitsui Chemicals Tohcello, Inc., Tokyo (JP)

( * ) Notice: Subject to any disclaimer, the term of this patent is extended or adjusted under 35 U.S.C. 154(b) by 186 days.

(21) Appl. No.: 13/976,630

(22) PCT Filed: Dec. 26, 2011

(86) PCT No.: PCT/JP2011/007277
§ 371 (c)(1),
(2), (4) Date: Jun. 27, 2013

(87) PCT Pub. No.: WO2012/090476
PCT Pub. Date: Jul. 5, 2012

(65) Prior Publication Data
US 2013/0269985 A1    Oct. 17, 2013

(30) Foreign Application Priority Data
Dec. 28, 2010 (JP) .................. 2010-292622

(51) Int. Cl.
| | |
|---|---|
| *H05K 1/02* | (2006.01) |
| *C08L 79/04* | (2006.01) |
| *H05K 1/03* | (2006.01) |
| *H05K 3/28* | (2006.01) |
| *C08G 18/28* | (2006.01) |

(Continued)

(52) U.S. Cl.
CPC ............ *H05K 1/0213* (2013.01); *C08G 18/003* (2013.01); *C08G 18/282* (2013.01); *C08G 18/7671* (2013.01); *C08G 18/8064* (2013.01); *C08L 79/04* (2013.01); *H05K 1/0346* (2013.01); *H05K 3/285* (2013.01); *B32B 2457/08* (2013.01); *H05K 3/4617* (2013.01)

(58) Field of Classification Search
None
See application file for complete search history.

(56) References Cited

U.S. PATENT DOCUMENTS 4,658,007 A * 4/1987 Marks et al. ............... 528/55
5,112,932 A * 5/1992 Koenig et al. .............. 528/51

(Continued)

FOREIGN PATENT DOCUMENTS

| CN | 1960606 A * | 5/2009 |
|---|---|---|
| JP | 52-31000 | 8/1977 |

(Continued)

OTHER PUBLICATIONS

JPO machine translation of JP-2006-213793, Aug. 17, 2006.*

(Continued)

*Primary Examiner* — Jeffrey Washville
(74) *Attorney, Agent, or Firm* — Brundidge & Stanger, P.C.

(57) ABSTRACT

A resin composition which is capable of forming a film that has excellent heat resistance and slidability/bendability; a protective film for circuits, which uses the resin composition; and a dry film or the like which comprises the protective film are provided. Other aspects are a circuit board and a multilayer circuit board, each of which has excellent heat resistance and slidability/bendability. Furthermore, a protective film for circuit boards is provided, which is arranged in contact with a circuit of a printed wiring board, and contains a polyoxazolidone resin that has a weight average molecular weight of $3 \times 10^4$ or more.

13 Claims, 2 Drawing Sheets

(51) Int. Cl.
*C08G 18/76* (2006.01)
*C08G 18/80* (2006.01)
*C08G 18/00* (2006.01)
*H05K 3/46* (2006.01)

(56) References Cited

U.S. PATENT DOCUMENTS

| | | | | |
|---|---|---|---|---|
| 5,138,016 | A | * | 8/1992 | Murdock et al. ............. 528/55 |
| 5,677,393 | A | * | 10/1997 | Ohmori et al. ............. 525/423 |
| 6,432,541 | B1 | | 8/2002 | Gan |
| 2010/0261837 | A1 | * | 10/2010 | Gan ............................. 524/590 |

FOREIGN PATENT DOCUMENTS

| | | |
|---|---|---|
| JP | 62-60641 A | 3/1987 |
| JP | 62-070473 A | 3/1987 |
| JP | 05-43657 A | 2/1993 |
| JP | 2859956 B2 | 12/1998 |
| JP | 2003522217 A | 7/2003 |
| JP | 2005-054027 | 3/2005 |
| JP | 2006-083289 | 3/2006 |
| JP | 2006-128808 | 5/2006 |
| JP | 2006-213793 | 8/2006 |

OTHER PUBLICATIONS

EPO machine translation of CN1960606 A, May 9, 2007.*
Lu et al., "Reactivity of Common Functional Rroups with Urethanes: Models for Reactive Compatibilization of Thermoplastic Polyurethane Blends", Univ. of Min, Apr. 2002, p. 2310-2328.*
International Search Report (PCT/ISA/210) issued on Mar. 5, 2012, by the Japanese Patent Office as the International Searching Authority for International Application No. PCT/JP2011/007277.

* cited by examiner

RESIN COMPOSITION, AND PROTECTIVE FILM, DRY FILM, CIRCUIT BOARD, AND MULTILAYER CIRCUIT BOARD CONTAINING SAME

TECHNICAL FIELD

The present invention relates to resin compositions, protective films containing the same, dry films, circuit boards, multilayer circuit boards and the like including the protective film.

BACKGROUND ART

Flexible circuit boards that include a printed circuit on a flexible substrate have heretofore been applied to a variety of electronic devices. The flexible circuit board typically includes a substrate, a circuit printed on the substrate, and a circuit protective layer for protecting the circuit.

For such a circuit protective film and a substrate for flexible circuit boards, heat-resistant resin films made of polyimide or other resin are widely used. Polyimides are prepared for example by dehydrative cyclization of polyamic acids which are produced by reaction between diamines and tetracarboxylic acid dianhydrides in solvent. The characteristics of polyamic acids and polyimides are governed by the kinds and combinations of the source diamines and tetracarboxylic acid dianhydrides. Among different types of polyimides, such polyimides are known that exhibit superior heat resistance and/or dimensional stability.

Aromatic polyimide materials prepared using, among different types of tetracarboxylic acid dianhydrides, aromatic tetracarboxylic acid dianhydrides exhibit superior heat resistance, mechanical properties, and flame retardancy. While these polyimides are superior in heat resistance, they may suffer from a drawback in their processability due for example to poor solubility in solvents or extremely high melting points.

Recently, slide cellular phones have become a focus of attention for their excellent features including design and are replacing conventional foldable cellular phones. A slide cellular phone refers to a cellular phone that includes a key pad unit (also referred to as a "main board unit") and a separate display unit on the key pad unit, so that the user can slide away the display unit to expose the key pad unit. To establish electrical connection between the key pad unit and display unit in the slide cellular phone, the above-described flexible circuit board is used. The flexible circuit board is bonded at one end to a portion of the key pad side electrical circuit board and at the other end to a portion of the display side electrical circuit board. Accordingly, the flexible circuit board is disposed being bent in U shape at a predetermined curvature radius. Along with opening and closing of the display unit, the U-shaped flexible circuit board is caused to slide back and forth repeatedly (see e.g., Patent Literature 1). It is therefore required for the flexible circuit board to resist breakage during the above-described reciprocating motion (called "sliding flexure"), i.e., to have excellent flexure fatigue life. More recently, as the slide cellular phones are becoming thinner, the size of a gap formed when the flexible electrical circuit board is bent in U shape, which size can be approximated by the diameter of curvature, is becoming smaller. Sliding conditions become more stringent with reducing gap size; therefore, circuit protective films for flexible circuit boards that can meet the stringent conditions have been required.

Flexible circuit board protective films known in the art that exhibit superior flexure fatigue life include circuit protective films prepared by bonding polyimide to substrates using an epoxy resin adhesive. However, a single layer of polyimide or epoxy resin was unable to be used as the circuit protective film. Although interlayer insulation materials containing polyimide or epoxy resin layer are known, they do not have good flexure fatigue life. Moreover, single-layered circuit protective layers consisting of a mixture of polyimide and acrylic resin or a mixture of epoxy resin and acrylic resin are known. These circuit protective layers, however, do not have good flexure fatigue life.

As heat-resistant resins that have characteristics similar to those of polyimides, polyoxazolidones are known which are produced by reacting diisocyanate compounds with epoxy resins (see, e.g., Patent Literatures 2-5). Methods of high-yield production of a high-molecular polyoxazolidone are also proposed wherein a dicarbamate compound, obtained by blocking the isocyanate of a diisocyanate compound, is reacted with an epoxy resin in the presence of a phosphazenium catalyst.

CITATION LIST

Patent Literature

PTL 1: Japanese Patent Application Laid-Open No. 2006-128808
PTL 2: Japanese Examined Patent Application Publication No, 52-31000
PTL 3: Japanese Patent Application Laid-Open No. 62-60641
PTL 4: Japanese Patent Application Laid-Open No. 62-70473
PTL 5: Japanese Patent No. 2,859,956
PTL 6: Japanese Patent Application Laid-Open No. 2005-54027
PTL 7: Japanese Patent Application Laid-Open No. 2006-213793

SUMMARY OF INVENTION

Technical Problem

However, technologies that utilize the polymer characteristics of polyoxazolidones have not yet been reported. When a polyoxazolidone is used alone, heating facilitates the formation of the allophanate linkage and/or buret linkage and crosslinking by the reaction of the remaining epoxy resin. In order to allow these reactions to proceed, however, heating to as high as 230° C. or above is required making control of the degree of crosslinking difficult. It has thus been impossible in the art to control the processability and/or flexibility of polyoxazolidones. In particular, it has been difficult in the art to apply polyoxazolidones to flexible circuit boards and the like.

The present invention has been made in view of the foregoing problems pertinent in the art, and an object thereof is to provide a resin composition capable of forming a film having superior heat resistance and flexure fatigue life; a circuit protective film prepared using the resin composition; a dry film including the resin composition; and the like. Another object of the present invention is to provide a circuit board and a multilayer circuit board which are superior in heat resistance and flexure fatigue life.

Solution to Problem

The present invention thus provides the following resin compositions; circuit protective films; dry films, circuit boards, multilayer circuit boards, and the like including the circuit protective film.

[1] A protective film for circuit board to be disposed in contact with a circuit of a printed circuit board, the protective film including:

a polyoxazolidone resin (A) having a weight-average molecular weight of $3\times10^4$ or more.

[2] The protective film according to [1], wherein the protective film is made of a resin composition, the resin composition containing the polyoxazolidone resin (A) and a thermosetting resin (C) having three or more reactive functional groups in one molecule thereof.

[3] The protective film according to [2], wherein the resin composition contains a flame retardant (B).

[4] The protective film according to any one of [1] to [3], wherein the polyoxazolidone resin (A) has a repeat unit represented by the following general formula (1):

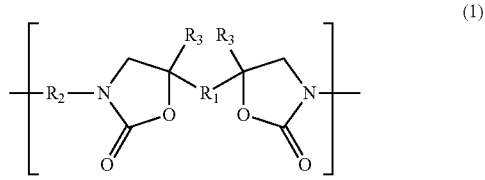

(1)

where $R_1$ and $R_2$ are independently $C_{1-60}$ divalent organic group, and each $R_3$ is independently hydrogen or $C_{1-6}$ hydrocarbon group.

[5] A dry film including:

a flexible support; and the protective film according to any one of [1] to [4] disposed on the flexible support.

[6] A circuit protective layer in a printed circuit board, wherein the circuit protective layer is made of a cured product of the protective layer according to any one of [2] to [4].

[7] A circuit board including:

a printed circuit board including a substrate and a circuit on the substrate; and a cured product of the protective film according to any one of [2] to [4], the cured product being laminated onto the printed circuit board so as to in contact with the circuit.

[8] The circuit board according to [7], wherein the circuit board is a flexible circuit board.

[9] A multilayer circuit board including:

two or more printed circuit boards laminated together, each including a substrate and a circuit on the substrate; and a cured product of the protective film according to any one of [2] to [4] disposed between a pair of the printed circuit boards.

[10] The multilayer circuit board according to [9], wherein the multilayer circuit board is a flexible multilayer circuit board.

[11] A resin composition including:

a polyoxazolidone resin (A) having a weight-average molecular weight of $3\times10^4$ or more; and a thermosetting resin (C) having three or more reactive functional groups in one molecule thereof.

[12] The resin composition according to [11], further including a flame retardant (B).

[13] The resin composition according to [11] or [12], wherein the polyoxazolidone resin (A) has a repeat unit represented by the following general formula (1):

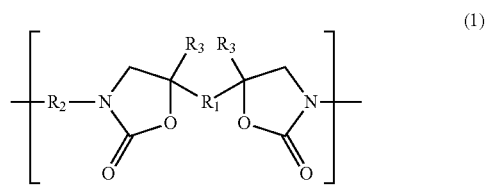

(1)

where $R_1$ and $R_2$ are independently $C_{1-60}$ divalent organic group, and each $R_3$ is independently hydrogen or $C_{1-6}$ hydrocarbon group.

[14] A method of manufacturing a circuit board, the circuit including: a printed circuit board that includes a substrate and a circuit disposed on the substrate; and a circuit protective layer laminated to the printed circuit board so as to be in contact with the circuit, the method including:

providing the printed circuit board;

disposing the protective film according to any one [1] to [4] on the circuit of the printed circuit board followed by vacuum lamination; and thermally curing the protective film to form the circuit protective layer.

Advantageous Effects of Invention

The circuit protective film of the present invention contains a polyoxazolidone having a particular weight-average molecular weight and is therefore superior in flexure fatigue life as well as in heat resistance and processability. The protective film thus provides a circuit board and a multilayer circuit board which are superior in flexure fatigue life, heat resistance, and the like.

DESCRIPTION OF EMBODIMENTS

Figure 1A:
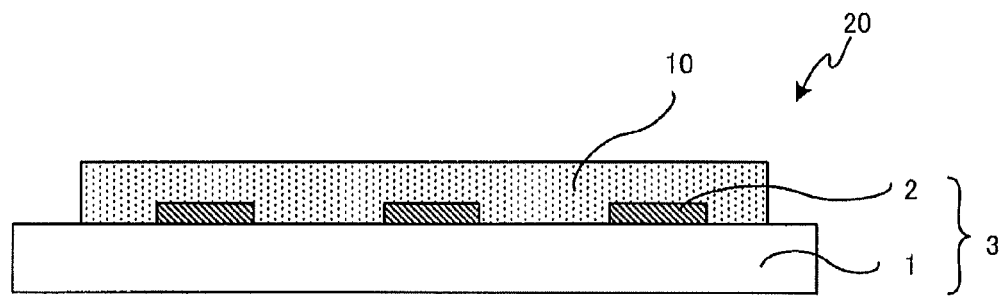
FIG. 1A is a schematic cross-sectional view illustrating an example of a circuit board of the present invention.

Embodiments of the present invention will now be described, which however shall not be construed as limiting the scope of the present invention.

1. Resin Composition

A resin composition of the present invention contains a predetermined polyoxazolidone resin (A), and optionally contains a flame retardant (B), and thermosetting resin (C) having three or more functional groups. A film or cured film of the resin composition is significantly superior in flexure fatigue life as well as is superior in heat resistance and processability.

(Polyoxazolidone Resin (A))

As long as polyoxazolidone resin (A) contains the oxazolidone structure, there are no particular limitations on the other structures of the polyoxazolidone resin. A polyoxazolidone resin having a repeat unit represented by the following general formula (1) can be exemplified.

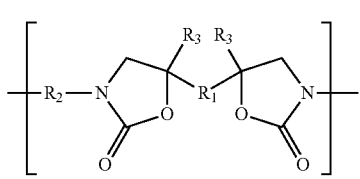
(1)

In general formula (1), $R_1$ and $R_2$ are independently $C_{1-60}$ divalent organic group. A specific example of $R_1$ is a group represented by any of the following formulas (i) to (iv):

(i) —$CH_2$—O—Ar—O—$CH_2$— (where Ar is a divalent aromatic group);
(ii) —$CH_2$—OCO—Ar—COO—$CH_2$— (where Ar is a divalent aromatic group);
(iii) —$CH_2$—O—X—O—$CH_2$— (where X is a divalent aliphatic group); and
(iv) —$CH_2$—OCO—X—COO—$CH_2$— (where X is a divalent aliphatic group).

Specific examples of the divalent aromatic group represented by Ar in formulas (i) and (ii) include groups represented by the following formulas (a) and (b) and general formula (c).

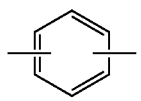
(a)

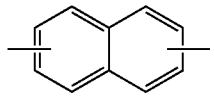
(b)

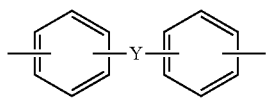
(c)

In general formula (c), Y is a single bond, —$CH_2$—, —O—, —S—, —$SO_2$—, —$C(CH_3)_2$—, or a moiety represented by the following formula (c-1):

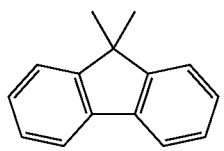
(c-1)

In formulas (i) and (ii), the divalent aromatic group represented by Ar may have an alkyl group such as methyl or ethyl group; and/or a halogen atom such as chlorine or fluorine.

Specific examples of the divalent aliphatic group represented by X in formulas (iii) and (iv) include a $C_{2-15}$ straight or branched alkylene group, a $C_{8-50}$ polyoxyalkylene group, and a $C_{2-50}$ unsaturated hydrocarbon group.

Specific examples of $R_2$ in general formula (1) include a $C_{6-20}$ divalent aromatic group; a $C_{1-60}$, preferably $C_{1-20}$, divalent aliphatic group; and a $C_{4-20}$ divalent alicyclic group. The "$C_{6-20}$ divalent aromatic group" among the specific examples of $R_2$ is preferably a group represented by any of the following formulas (d) to (f) and the general formula (g).

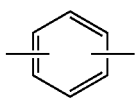
(d)

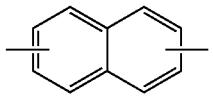
(e)

(f)

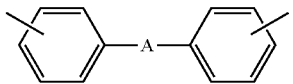
(g)

In general formula (g), A is a single bond, —$CH_2$—, or —$C(CH_3)_2$—. The aromatic ring of these aromatic groups may have one to four $C_{1-6}$ alkyl groups attached.

The "$C_{1-60}$ divalent aliphatic group" among the specific examples of $R_2$ in general formula (1) is preferably a straight or branched alkylene such as methylene, tetramethylene, pentamethylene or 2,2,4 (or 2,4,4)-trimethyl-1,6-hexylene, or a group represented by the following formula (h).

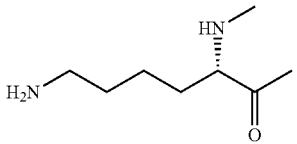
(h)

The "$C_{4-20}$ divalent alicyclic group" among the specific examples of $R_2$ in general formula (1) may be any of monocyclic, polycyclic and bridged cyclic groups. The "$C_{4-20}$ divalent alicyclic group" among the specific examples of $R_2$ is preferably a group represented by the following formula (i), (j), (m) or (n) or a group represented by the following general formula (k) or (l).

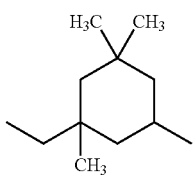
(i)

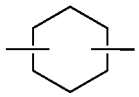
(j)

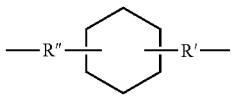
(k)

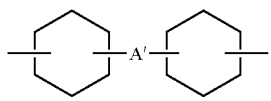

(l)

(m)

(n)

R' and R" in general formula (k) are independently a $C_{1-4}$ alkylene group. A' in general formula (1) is a single bond, —$CH_2$—, or —$C(CH_3)_2$—.

In general formula (1), each $R_3$ is independently hydrogen or $C_{1-6}$ hydrocarbon group such as methyl or ethyl group.

The polyoxazolidone resin (A) may be terminated with an epoxy group or —$NHR_4$ at a chain end, where $R_4$ is hydrogen or —$COOR_5$. $R_5$ is a $C_{1-12}$ alkyl group, a $C_{1-12}$ alkoxyalkyl group, or a $C_{1-12}$ monovalent organic group represented by $R^a$—$(OR^b)m$-, where $R^a$ is an alkyl group, $R^b$ is an alkylene group, and m is an integer of 1-11.

The repeat unit represented by general formula (1) in polyoxazolidone resin (A) preferably comprises 30 mol % or more, more preferably 50 mol % or more, of the total repeat units. When the amount of the repeat unit represented by general formula (1) is less than 30 mol % in the polyoxazolidone resin, the stiffness of a film made of the resin composition may be compromised, as well as heat resistance may be reduced and flexural fatigue life may be significantly reduced.

The number of the repeat unit represented by general formula (1) contained in one molecule of polyoxazolidone resin (A) is preferably 30 or more, more preferably 50 or more. When the number of the repeat unit is too small, stiffness and/or heat resistance of polyoxazolidone resin (A) decrease, and the flexural fatigue life of a film made of the resin composition shortens as well.

The weight-average molecular weight of polyoxazolidone resin (A) is $3 \times 10^4$ or more, preferably $3 \times 10^4$ to $2 \times 10^5$, and more preferably $5 \times 10^4$ or more. By employing polyoxazolidone resin (A) having a weight-average molecular weight of $3 \times 10^4$ or more, the flexural fatigue life of a film made of the resin composition significantly improves. The molecular weight of polyoxazolidone resin (A) can be controlled for example by the numbers of equivalents of isocyanate and epoxy groups, the number of isocyanate and epoxy groups, or reaction conditions. By controlling the molecular weight of polyoxazolidone resin (A) it is also possible to appropriately adjust the tackiness and/or thermal bonding property of a film made of the resin composition.

(Production Process of Polyoxazolidone Resin (A))

Polyoxazolidone resin (A) containing the repeat unit represented by general formula (1) can be produced by the reaction of a dicarbamate compound represented by the following general formula (2) with a diepoxy compound represented for example by the following general formula (3):

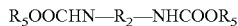

(2)

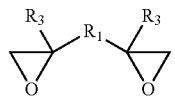

(3)

$R_1$ to $R_3$ in general formulas (2) and (3) are defined the same as those in general formula (1). $R_5$ in general formula (2) is a $C_{1-12}$ alkyl group, a $C_{1-12}$ alkoxyalkyl group, or a $C_{1-12}$ monovalent organic group represented by $R^a$—$(OR^b)m$-, where $R^a$ is an alkyl group, $R^b$ is an alkylene group, and m is an integer of 1-11.

The dicarbamate compound represented by general formula (2) can be produced by reacting the corresponding diisocyanate compound with a blocking agent to block the isocyanate group of the diisocyanate compound. As the diisocyanate compound, for example, aromatic, aliphatic and alicyclic diisocyanates can be used.

Specific examples of the aromatic diisocyanate include tolylene diisocyanate (TDI), 4,4'-diphenylmethane diisocyanate (MDI-PH), 1,5-naphthalene diisocyanate (NDI), 3,3'-dimethyldiphenyl-4,4'-diisocyanate (TODI), o-xylylene diisocyanate, m-xylylene diisocyanate, and p-xylylene diisocyanate.

Aliphatic and alicyclic diisocyanates are a class of compounds having isocyanate groups bound to methylene, methine or isopropylidene. Specific examples of the aliphatic and alicyclic diisocyanates include a $C_{4-18}$ (preferably $C_{5-14}$, more preferably $C_{6-12}$) aliphatic diisocyanate such as tetramethylene diisocyanate, pentamethylene diisocyanate, hexamethylene diisocyanate (HDI), 2,2,4 (or 2,4,4)-trimethyl-1,6-diisocyanatohexane, and lysine diisocyanate; a $C_{8-22}$ (preferably $C_{8-18}$, more preferably $C_{8-16}$) alicyclic diisocyanate such as isophorone diisocyanate (IPDI), 1,4-diisocyanatocyclohexane, 1,3-bis(isocyanatomethyl)-cyclohexane, 1,4-bis(isocyanatomethyl)-cyclohexane, 1,3-bis(2-isocyanatopropyl-2-yl)-cyclohexane, 4,4'-dicyclohexylmethane diisocyanate, norbornane dimethyl diisocyanate, and norbomane diisocyanate; and a $C_{8-22}$ (preferably $C_{8-18}$, more preferably $C_{8-16}$) aromatic ring-containing aliphatic diisocyanate such as tetramethyl xylylene diisocyanate and xylylene diisocyanate.

As the blocking agent, monoalcohols can be employed. Specific examples of the monoalcohols include methanol, ethanol, propanol, isopropyl alcohol, n-butanol, 2-ethylhexanol, butyl cellosolve, and polyethylene glycol monoethyl ether. In particular, 2-ethylhexanol, butanol, and isopropanol are preferable. These monoalcohols can be used alone or in combination.

The amount of the blocking agent to be reacted with the diisocyanate compound may be equal to or smaller than the equivalent of isocyanate groups on the diisocyanate compound. However, even when an amount of the blocking agent is used that is greater than the equivalent of the isocyanate groups, unreacted blocking agents (monoalcohol) can be recovered. The reaction temperature of the diisocyanate compound with blocking agent is typically 20-150° C.

Typically, the diisocyanate compound and blocking agent are reacted together, and then the resultant dicarbamate compound is allowed to undergo a condensation reaction with the diepoxy compound.

Alternatively, the diisocyanate compound may be added to a mixture of the diepoxy compound and blocking agent allowing the diisocyanate compound to be reacted with the blocking agent in the system so that the resultant dicarbamate compound undergoes a condensation reaction with the diepoxy compound.

As the diepoxy compound, for example, diglycidyl ethers, diglycidyl esters, linear aliphatic epoxies, and alicyclic epoxides can be employed.

Specific examples of the diglycidyl ethers include bisphenol epoxy resins prepared by diglycidylation of such bisphenols as bisphenol A, bisphenol F, bisphenol AD, bisphenol S, tetramethyl bisphenol A, tetramethyl bisphenol F, tetramethyl bisphenol AD, tetramethyl bisphenol S, tetrabromobisphenol A, tetrachloro bisphenol A, and tetrafluoro bisphenol A; and epoxy resins prepared by diglycidylation of such divalent phenols as biphenol, dihydroxy naphthalene, 9,9-bis(4-hydroxyphenyl)fluorene, resorcinol, hydroquinone, and diglycidyl ether of o-, m-, or p-phthalic acid.

Specific examples of the diglycidyl esters include diglycidyl terephthalate, diglycidyl phthalate, and diglycidyl esters of hexahydrophthalic acid or dimer acid.

Specific examples of the linear aliphatic epoxides include diglycidyl ethers of $C_{2-15}$ alkanediol or $C_{8-50}$ polyalkylene glycol, neopentyl glycol diglycidyl ether, epoxidized polybutadiene, and epoxidized soybean oil. Specific examples of the alicyclic epoxides include 3,4-epoxy-6-methylcyclohexyl carboxylate, 3,4-epoxycyclohexylcarboxylate, and products under the tradename "Celloxide 2021" and "Celloxide 3000" both manufactured by Daicel Corporation.

The reaction between the dicarbamate compound and diepoxy compound may be accomplished by heating a mixture of the two compounds in the presence of a catalyst. In this reaction, the mole ratio of the dicarbamate compound to the diepoxy compound is preferably set within a desired range. More specifically, the dicarbamate compound is preferably added in an amount of 0.8-1.2 moles per 1 mole of diepoxy compound (per two equivalents of epoxy groups). When the mole ratio of the dicarbamate compound to the diepoxy compound (dicarbamate compound/diepoxy compound) is less than 0.8, crosslinking of the diepoxy compound is facilitated which may result in the resultant resin (A) (polyoxazolidone) having a low molecular weight and being gelated. When the mole ratio of the dicarbamate compound to the diepoxy compound (dicarbamate compound/diepoxy compound) exceeds 1.2, production of allophanate compounds derived from the excessive dicarbamate compound is facilitated which may result in the resultant resin (A) having insufficient heat resistance. More preferably, the mole ratio of the dicarbamate compound to the diepoxy compound (dicarbamate compound/diepoxy compound) is set to 0.9-1.2.

Reacting the mixture of the dicarbamate compound and diepoxy compound in the above-described mole ratio under heating in the presence of a catalyst affords a polyoxazolidone terminated with an alkylcarbamate group at a chain end. The reaction can be carried out either in the absence of any solvent or in an aprotic polar solvent. Specific examples of the aprotic polar solvent include N,N-dimethylformamide (DMF), N,N-dimethylacetamide (DMAc), N-methyl-2-pyrrolidone (NMP), tetrahydrofuran (THF), ethylene glycol dimethyl ether, ethylene glycol diethyl ether, ethylene glycol dipropyl ether, ethylene glycol ethylmethyl ether, diglyme (diethylene glycol dimethyl ether), diethylene glycol diethyl ether, propylene glycol dimetyl ether, propylene glycol diethyl ether, dipropylene glycol dim ethyl ether, cyclopentanone, cyclohexanone, 1,4-dioxane, dimethyl sulfoxide (DMSO), methyl isobutyl ketone, methyl cellosolve acetate, ethyl cellosolve acetate, propyl cellosolve acetate, butyl cellosolve acetate, propylene glycol monomethyl ether acetate, propylene glycol monoethyl ether acetate, and propylene glycol monopropyl ether acetate. The aprotic polar solvents can be used alone or in combination. Nonpolar solvents which are compatible with the aprotic polar solvents can be used in combination. Examples of the nonpolar solvent include aromatic hydrocarbons such as toluene, xylene, mesitylene, and solvent naphtha. A mixture of the aprotic polar solvent and nonpolar solvent preferably contains no greater than 30 wt % of the nonpolar solvent. A nonpolar solvent content of greater than 30 wt % reduces the dissolving power of the solvent which may cause precipitation of the polyoxazolidone.

Mixing of the dicarbamate compound and diepoxy compound may be accomplished by adding dropwise either stepwise or continuously the dicarbamate compound as it is or mixed with a solvent into the diepoxy compound which is pre-heated to an appropriate temperature. The catalyst may be pre-mixed with the dicarbamate compound. The dicarbamate compound is typically added dropwise over 30 minutes or longer, preferably 1-10 hours, and still more preferably 2-5 hours. When the addition time is too short, the concentration of the dicarbamate compound becomes non-uniform in the system, which may cause unwanted side reactions. On the other hand, when the addition time is too long, the self-reaction of the diepoxy compound may be facilitated.

The reaction temperature is typically 100-230° C., preferably 150-200° C., and more preferably 160-180° C. When the reaction temperature is too high, the raw material may easily undergo self-reactions. On the other hand, when the reaction temperature is too low, the reaction is not easily completed which may make it difficult to increase the molecular weight of the resultant polyoxazolidine to a sufficiently high level. Moreover, when the reaction temperature is too low, production of resin which has abundant isocyanurate rings is facilitated which may reduce the resultant resin's physical properties such as flexibility and/or adhesion. The reaction time is typically 1-15 hours, preferably 2-10 hours, and more preferably 4-8 hours.

Examples of the catalyst include metal alcoholates such as lithium butoxide and sodium methoxide; Lewis acids such as lithium chloride and aluminum chloride; mixtures of the above-mentioned Lewis acids and Lewis bases such as biphenyl phosphine oxide; quarternary ammonium salts such as chloride, bromide, iodide or acetate of tetramethylammonium, tetraethylammonium, tetrabutylammonium, trilaurylmethylammonium, and benzyltributylammonium; tertiary amines such as triethylamine, dibutylmethylamine, N,N-dimethylbenzylamine, N,N,N',N'-tetramethylethylenediamine, 1,5-diazabicyclo(4,3,0)nonene-5,1,8-diazabicyclo[5.4.0]undecene-77 (DBU), 6-dibutylamino-1,8-diazabicyclo[5.4.0]undecene-7,1,4-diazabicyclo[2.2.2]octane, and N-methylmorpholine; and imidazoles such as 1,2-dimethylimidazole, 1-benzyl-2-phenylimidazole, 1-benzyl-2-methylimidazole, 2-undecylimidazole, 2-heptadecylimidazole, 2-ethyl-4-methylimidazole, 1-cyanoethyl-2-ethyl-4-methylimidazole, 1-cyanoethyl-2-methylimidazole, and 2-phenylimidazole.

Among the above-described catalysts, 1,2-dimethylimidazole, 1-benzyl-2-phenylimidazole, 2-heptadecylimidazole, 1-cyanoethyl-2-ethyl-4-methylimidazole, and 1-cyanoethyl-2-methylimidazole are preferable because of their high activity in the temperature range within which an oxyzolidone ring is formed. These catalysts can be used alone or in combination. The amount of catalyst used is typically 0.005-0.2 mol %, preferably 0.01-0.1 mol %, with respect to the carbamate group.

A dissociation promoter that promotes the dissociation of the blocking agent can be used in combination with the catalyst. Examples of the dissociation promoter include salts of organic metals such as tin, zinc, and lead. The amount of dissociation promoter used is typically 0.005-0.1 mol % with respect to the carbamate group.

A polyoxazolidone terminated with a primary amino group (—NH$_2$) at a chain end can be produced by reacting together the dicarbamate compound and diepoxy compound, followed by hydrolysis.

(Flame Retardant (B))

The resin composition may contain various types of additives for conferring required characteristics to a film made of the resin composition. For example, addition of flame retardant (B) can provide a film having superior flame retardancy.

Examples of flame retardant (B) include halogen-containing compounds, phosphorus-containing compounds, and inorganic flame retardants, with phosphorus-containing compounds being preferable. When a phosphorus-containing compound is used as flame retardant (B), the resin composition is advantageously free from halogen atoms, and further advantageously, the processability of the resin composition and the flexural fatigue life of a film made of the resin composition improve.

Specific examples of the phosphorus-containing compounds include phosphazene compounds, 9,10-dihydro-9-oxa-10-phosphaphenanthrene 10-oxide (HCA), 9,10-dihydro-9-oxa 10-(2,5-dihydroxyphenyl)phosphaphenanthrene-10-oxide (HCA-HQ), n-butylbis(3-hydroxypropyl) phosphine oxide, n-bis(2-hydroxycarbonylethyl)phosphine oxide, diglycidylphenyl phosphine oxide, triglycidoxy methyl phosphine oxide, diglycidoxy phenyl phosphine oxide, triglycidyl ether of tri(3-hydroxypropyl)phosphine oxide, diglycidyl ether of di(3-hydroxypropyl) 2-methyl phosphine oxide, tris(p-glycidoxyphenynoxy)phosphine oxide, dialkyl(2,5-dihydroxyphenyl)phosphine oxide (where "alkyl" is a C$_{1-12}$ aliphatic alkyl), and diphenylphosphinyl hydroquinone. These phosphorus-containing compounds can be used alone or in combination.

An adduct of a particular compound with the above-described phosphorus-containing compound can also be used as flame retardant (B). Specific examples of such an adduct include an adduct of triglycidyl ether of 4,4'-[1-[4-[1-(4-hydroxyphenyl)-1-methyl ethyl]phenyl]ethylidene]bisphenol with HCA; an addition copolymer of triglycidyl ether of 4,4'-[1-[4-[1-(4-hydroxyphenyl)-1-methylethyl]phenyl]ethylidene]bisphenol with 9,10-dihydro-9-oxa-10-(2,5-dihydroxyphenyl)phosphaphenanthrene-10-oxide (HCA-HQ); and an addition copolymer of triglycidyl ether of 4,4'-[1-[4-[1-(4-hydroxyphenyl)-1-methylethyl]phenyl]ethylidene] bisphenol with a reaction product of diglycidoxyphenyl phosphine oxide and bisphenol A.

The amount of phosphorus atoms in the phosphorus-containing compound or adduct thereof is preferably 1 wt % or more, more preferably 5 wt % or more. By setting the phosphorus atom content to 1 wt % or more, preparing a resin composition having flame retardant effects is made possible.

When the phosphorus-containing compound is singly used as flame retardant (B), the phosphorus-containing compound is preferably added such that the amount of phosphorus atoms (P content) in the resin composition is 0.7-4.0 wt %, more preferably added such that the amount of phosphorus atoms is 1.2-3 wt %. By setting the phosphorus atom content in the resin composition to 0.7 wt % or more, preparing a resin composition having flame retardant effects is made possible. By setting the phosphorus atom content in the resin composition to 4.0 wt % or less, it is possible to allow the phosphorus-containing compound to be kept compatible with the resin upon mixing, allowing the resin composition to stably exhibit its characteristics. For example, it is possible to prepare a resin composition that has stable flame retardancy and storage stability as well as high glass transition temperature (Tg).

When the halogen-containing compound is used as flame retardant (B), the halogen-containing compound is preferably added in an amount of 0.1-10 parts by weight in terms of halogen content per 100 parts by weight of the total resin components. When the phosphorus-containing compound is used in combination with one or more other flame retardants, the phosphorus-containing compound is preferably added in an amount of 0.1-4 parts by weight in terms of phosphorus content per 100 parts by weight of the total resin components. Moreover, when the inorganic flame retardant is used as flame retardant (B), the inorganic flame retardant is preferably added in an amount of 25-150 parts by weight per 100 parts by weight of the total resin components.

As flame retardant (B), the halogen-containing compound, phosphorus-containing compound, inorganic flame retardant and the like can be used alone or in combination.

(Thermosetting Resin (C))

To the resin composition is preferably added thermosetting resin (C) having three or more reactive functional groups in one molecule thereof. Addition of thermosetting resin (C) increases the resin composition's adhesion. Addition of thermosetting resin (C) also enables thermal curing of the resin composition to be carried out at relatively low temperatures (e.g., 230° C. or below) and also improves flexural fatigue life of a film made of the resin composition.

Thermosetting resin (C) is preferably a non-thermoplastic resin, and thermosetting resin (C) preferably has three to four reactive functional groups in one molecule thereof. The reactive functional group refers to a thermally crosslinkable group; examples thereof include epoxy group, isocyanate group, acrylic group, vinyl group, allyl group, amino group, carboxyl group, hydroxyl group, aldehyde group, carbonyl group, ester group, and imide. Among different types of thermosetting resin (C), epoxy resins, thermosetting polyimides, acrylate compounds, and the like are preferable.

As the epoxy resins, epoxy resins having three or more epoxy groups in one molecule thereof are preferable. As the thermosetting polyimides, polybismaleimide resins, BT resins, and polyimide resins terminated with nadic acid, and the like can be employed. As the acrylate compounds, acrylate compounds having three or more acrylic groups in one molecule thereof are preferable. These thermosetting resins can be used alone or in combination.

The average molecular weight between crosslinks of thermosetting resin (C) is preferably 1.0×10$^4$ or less, more preferably 5.0×10$^3$ or less. Addition of thermosetting resin (C) having an average molecular weight between crosslinks of 1.0×10$^4$ or less may improve the adhesion of the resin composition to various types of adhesion target. Moreover, setting the average molecular weight between crosslinks to 1.0×10$^4$ or less increases the strength of a film or cured film of the resin composition and therefore improves the film's flexural fatigue life as well as chemical resistance. The average molecular weight between crosslinks of thermosetting resin (C) is calculated using the following equation based on the measured value of its modulus of elasticity (C) at 250° C.

$$Mc = 2(1+\mu)\rho RT/E'$$

where Mc is average molecular weight between crosslink points (g/mol), μ is Poisson's ratio (assumed to be 0.5), ρ is density (g/m³), R is gas constant (8.314 J/K/mol), T is absolute temperature (K), and E' is modulus of elasticity (Pa).

The content amount of thermosetting resin (C) in the resin composition is preferably 5-90 wt %, more preferably 10-50 wt %, based on the total amount (100 wt %) of the resin components, i.e., polyoxazolidone resin (A) and thermosetting resin (C). The adhesion of a film made of the resin composition increases with increasing thermosetting resin (C) content. However, when the thermosetting resin (C) content is too high, a cured article of the resin composition becomes less flexible which may reduce flexural fatigue life. Preferably, additives such as curing agents and/or curing promoters are added to the resin composition in combination with thermosetting resin (C). By controlling the added amount of the curing promoter, it is possible to adjust the curing rate of a film made of the resin composition.

(Additional Additives)

The resin composition of the present invention can contain "additional additives" as needed without compromising the effects of the present invention. Examples of the "additional additives" include inorganic fillers, antifoaming agents, leveling agents, and surface tension adjusters.

Examples of the inorganic fillers include silica, alumina, titanium oxide, talc, calcination talc, kaolin, burnt kaolin, mica, clay, aluminum nitride, and glass. Addition of a coupling agent to the resin composition together with inorganic fillers will advantageously improve adhesion between the resin components (including polyoxazolidone resin (A) and thermosetting resin (C)) and the inorganic filler. The amount of the inorganic filler in the resin composition is typically 10-150 parts by weight per 100 parts by weight of the total amount of the resin components. The respective amounts of the antifoaming agent, leveling agent and surface tension adjuster in the resin composition are typically 0.0005-10 parts by weight per 100 parts by weight of the total amount of the resin components.

2. Applications of Resin Composition

A film made of the above-mentioned resin composition exhibits superior flexural fatigue life as well as superior heat resistance and processability. Accordingly, the film is suitable as a protective film for the circuit of printed circuit boards. By employing a film made of the resin composition as the protective film, it is possible to provide a flexible circuit board or a flexible multilayer board that has superior flexural fatigue life. Moreover, the film can be laminated onto a printed circuit board without providing any intervening layer such as an adhesive layer, making it possible to slim down the circuit board manufactured. Because the film made of the resin composition can also be easily processed, e.g., stamped, the film can be used as a protective film for the circuit of various types of printed circuit boards. Further, since the resin composition has high heat resistance, the film can be used as a protective film that requires reflow heat resistance. After bonded to a circuit board or the like, the film made of the resin composition can maintain in film form without being broken into pieces, making the circuit board or multilayer circuit board in which the film is provided highly reliable.

As illustrated in the schematic cross-sectional view depicted in FIG. 1A, a protective film made of the above-mentioned resin composition is for example film 10 to be disposed in contact with circuit 2 of printed circuit board 3 for protecting circuit 2. For example, as illustrated in FIG. 1A, protective film 10 protects circuit 2 of printed circuit board 3 from impacts and the like from the outside and thereby prevents breakage of circuit 2 and/or provides electrical insulation between parts of circuit 2.

Figure 1B:
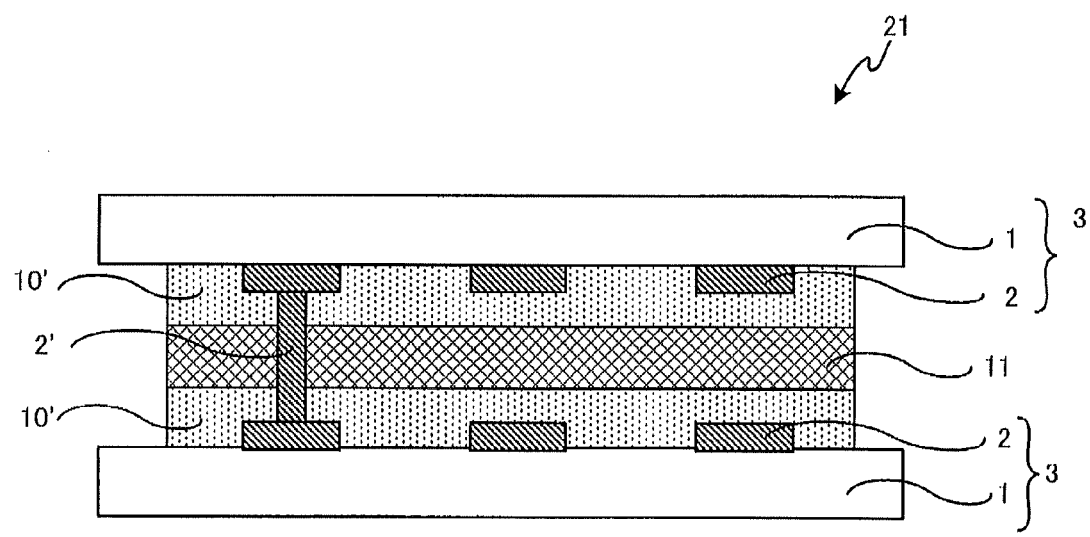
FIG. 1B is a schematic cross-sectional view illustrating an example of a multilayer circuit board of the present invention.

As illustrated in FIG. 1A, the protective film made of the above-mentioned resin composition can be used for example as film 10 laminated onto printed circuit board 3 of circuit board 20. As illustrated in FIG. 1B, the protective film can also be used as interlayer dielectric 11 disposed between a pair of printed circuit boards 3 of multilayer circuit board 2 that includes a plurality of printed circuit boards 3. Typically, interlayer dielectric 11 is disposed in contact with circuit 2' that is disposed in a through hole by which adjacent printed circuit boards 3 are coupled. Additionally, the protective film made of the above-mentioned resin composition can be used for example as film 10' that is directly laminated on printed circuit board 3 of multilayer circuit board 21.

Figure 2:
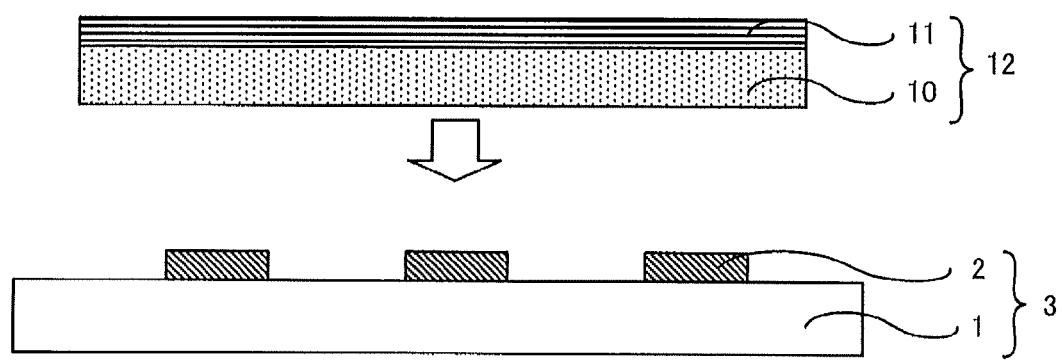
FIG. 2 is an explanatory view illustrating a method of laminating a circuit protective film of the present invention onto a printed circuit board.

Lamination of the protective film on a printed circuit board or the like is accomplished for example by, as illustrated in FIG. 2, providing dry film 12 having protective film 10 formed on flexible support 11 and by bonding dry film 12 to printed circuit board 3 or the like.

Dry Film

As illustrated in FIG. 2, the dry film includes for example flexible support (carrier film) 11 and protective film 10 disposed on flexible support 11. On the side remote from flexible support 11, the dry film may include an overcoat (not shown) for protecting protective film 10.

Protective film 10 is a layer produced by forming the above-mentioned resin composition into a film. The thickness of protective film 10 is appropriately determined according to the intended application and is typically 5-100 μm, preferably 10-75 μm, and more preferably 20-50 μm. When the protective film has a thickness falling under the above-mentioned ranges, the dry film becomes easy to handle, and moreover, the protective film or protective film in cured form exhibits superior flexural fatigue life.

Flexible support (carrier film) 11 is preferably a film made of less moisture-permeable resin. Less moisture-permeable resins usable herein include low density polyethylene, high density polyethylene, polypropylene, polyesters, polyethylene terephthalate, polycarbonate, polyarylate, and ethylene/cyclic olefin copolymers.

The thickness of flexible support 11 is typically 15-100 μm, preferably 15-75 μm. When the thickness of the flexible support falls under the above-described ranges, the resin composition exhibits good coatability and/or adhesion. Moreover, thicknesses of the flexible support falling under the above-described ranges not only allows the resultant dry film to be easily rolled up and exhibit improved stiffness, but are advantageous in terms of costs.

The overcoat (not shown) is preferably made of less moisture permeable resin as with the above-mentioned flexible support. The overcoat needs not to be transparent. Desirably, the overcoat can be easily peeled off, with the adhesion between the overcoat and protective film 10 being preferably smaller than the adhesion between flexible support 11 and protective film 10. Preferable examples of the resin constituting the overcoat include ethylene/cyclic olefin copolymers, polyethylene terephthalate, polyethylene, and polypropylene. It only suffices that the thickness of the overcoat is 5-100 μm.

Dry film 12 can be manufactured for example as follows: The resin composition is diluted with a solvent such that the solid content is 30-90 wt %, and applied to a uniform thickness over flexible support 11. Thereafter the coated film is dried to form protective film 10.

There are no particular limitations on the solvent for diluting the resin composition as long as the solvent does not compromise the solubility and drying rate of the resin. In order to ensure drying rate and surface level, it is preferable to employ such a solvent that has a boiling point similar to the boiling point of the solvent used for production of the polyoxazolidone. Application of the resin composition over flexible support 11 can be accomplished by any of the methods known in the art using a reverse roll coater, a gravure roll coater, a comma coater, curtain coater, or the like. Drying of the coated film may be accomplished using a hot dryer, a far infrared dryer, or a near-infrared dryer. Drying temperature is typically 50-150° C., preferably 70-120° C. Drying time is typically 2-30 minutes. After drying of the resin composition, the dry film may be processed, e.g., stamped to match the circuit pattern of a printed circuit board to which the dry film is to be bonded.

Printed Circuit Board

Printed circuit board 3 to be bonded to protective film 10 may include substrate 1 and circuit 2 formed of a metal layer on substrate 1. Printed circuit board 3 may include an additional layer where necessary. Substrate 1 can be a polyimide film or the like and preferably has flexibility.

When a commercially available non-thermoplastic polyimide film is used as the polyimide film, the film thickness is typically 3-75 μm, preferably 7.5-40 μm. The polyimide film may be subjected to plasma treatment, corona discharge treatment and/or the like on its surface.

Figure 3:
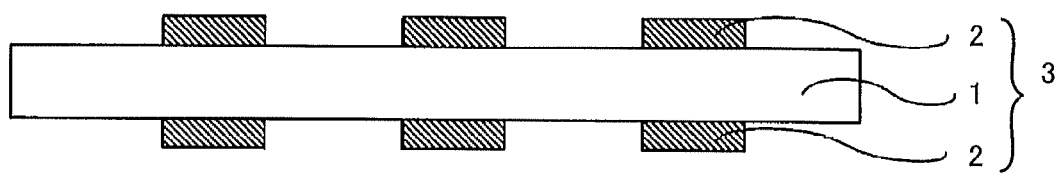
FIG. 3 is a schematic cross-sectional view illustrating an example of a printed circuit board.

Circuit 2 is preferably formed of a metal layer made of a material selected from copper, copper alloy, stainless steel, stainless steel alloy, nickel, nickel alloy (including 42 alloy), aluminum, aluminum alloy, and the like. The metal layer may be a metal foil bonded to substrate 1 or may be deposited onto substrate 1 by sputtering or the like. Circuit 2 may be formed on either one side (as illustrated in FIG. 1A) or both sides (as illustrated in FIG. 3) of substrate 1.

There are no particular limitations on the thickness of the metal layer constituting circuit 2 as long as circuit 2 is thick enough not to cause breakage or the like; the thickness of the metal layer is preferably 0.1-300 μm, more preferably 2-250 μm, and still more preferably 3-200 μm.

Method of Lamination of Protective Film

When the protective film is to be laminated onto the printed circuit board, printed circuit board 3 and dry film 12 are first provided. Lamination can then be accomplished by overlaying protective film 10 of dry film 12 onto circuit 2 of printed circuit board and pressure-bonding dry film 12 and printed circuit board 3 together. There are no particular limitations on the method of pressure-bonding; for example, surface-to-surface pressure bonding, roll pressure bonding or the like may be employed. Further, vacuum lamination is most preferable. The reason for this is that the patterned circuit is well buried in protective film by the vacuum lamination process. Flexible support 11 may be peeled off after bonding protective film 10 to printed circuit board 3.

When, for example, the above-described resin composition contains thermosetting resin (C), it is preferable to thermally crosslink protective film 10 disposed on the circuit of the printed circuit board so that protective film 10 serves as a circuit protective film that is more reliable in terms of circuit protection. Thermal crosslinking of protective film 10 increases the crosslinking density within protective film 10 and thus improves flexural fatigue life as the circuit protective film. Heat treatment can be carried out either stepwise or continuously at typically 130-300° C., preferably 150-230° C., for 0.1-5 hours.

When protective film 10 is used as an interlayer dielectric of a multilayer circuit board, two printed circuit boards are provided, and one of the printed circuit boards is overlaid onto protective film 10 of a dry film. Thereafter, for example, flexible support 11 of the dry film is peeled off, and the other printed circuit board is overlaid on and heat-pressure bonded to protective film 10 to manufacture a multilayer circuit board in which the printed circuit board, interlayer dielectric, and printed circuit board are sequentially layered. When a through-hole is to be bored in protective film 10, it is preferable to previously stamp protective film 10. When more printed circuit boards are to be laminated, the above-described steps may be repeated.

Heat-pressure bonding is preferably carried out typically at a pressure of 0.2-3 MPa under heating to 40-150° C., preferably to 50-120° C. When "the heat-pressure bonding possible temperature" is set to 40° C. or above, tackiness does not occur upon aligning of the protective film with the printed circuit board before heat-pressure bonding, thus improving working efficiency. When the heat-pressure bonding possible temperature is set 150° C. or below, curing of polyoxazolidone resin (A) does not proceed excessively allowing for adequate time for pressure bonding so that a wider process margin is ensured. Heat-pressure bonding possible temperature means a temperature at which the viscosity of the film can be controlled to a level that the material of film can sufficiently fill the pattern without causing such problems air trapping and that the material never flows outside the pattern due to excessive flow.

EXAMPLES

The present invention will now be described in more detail based on Examples, which however shall not be construed as limiting the scope of the invention thereto. Methods of measuring various physical properties and methods of evaluating various characteristics are given below.

[Weight-Average Molecular Weight (Mw)]

0.2 g of resin was dissolved in 5 ml of dimethylformamide (DMF) to prepare a sampling liquid. Using gel permeation chromatograph (GPC) (instrument: Shimadzu LC-10A, column: Shimadzu CTO-10A, detector: Shimadzu RID-10A, calculator: Shimadzu C-R7Aplus), the sample liquid was analyzed at a flow rate of 1.0 ml/min and at 40° C., and the weight-average molecular weight (Mw) of the resin was measured using the calibration curve prepared from polypropylene glycol (PPG) standards.

[State of Dry Film]

The resin composition (varnish) was applied on a 38 μm-thick carrier film (polyethylene terephthalate flexible support) using a comma coater, and the varnish was dried for 5 minutes at 120° C. in a roll supported-hot drying furnace to prepare a dry film having the dried resin layer (protective film) of 38 μm thickness. The resin layer (protective film) was visually observed as to whether or not the resin film maintained in film form when the carrier film was peeled off from the dry film. Evaluation criteria are as follows:

No breakage of dry film: A
Partial breakage of dry film: B
Dry film was broken into pieces: C

[Flexural Fatigue Test]

As a flexural fatigue pattern, a copper-clad flexible laminate (copper foil/insulating layer/copper foil=12 μm/12 μm/12 μm thickness, L/S=75 μm/75 μm) was provided, and a dry film was attached to the laminate so that the resin layer (protective film) was against the copper foil of the laminate. After laminating the assembly in vacuo at 130° C. and 3 MPa, the carrier film was peeled off, and the resin layer was cured at 185° C. for 60 minutes in a circulating hot air oven. In this way a laminate was manufactured in which a 10 μm-thick circuit protective film was formed on the copper foil. In accordance with "IPC-TM-650 method 2.4.3," the number of flexural fatigue cycles was measured for the laminate.

Pretreatment: IR Max260° C.
Stroke: 50 min
Speed: 10 rpm
Radius (Gap): 1.0 mm (2.0 mm)
Temperature: 23° C.
Determination: 10% increase in resistance

[Flame Retardancy Test]

Dry films (each 38 μm in thickness) were respectively attached to both sides of a polyimide film prepared by etching away the copper foils of a copper-clad flexible laminate (NEOFLEX® NFX-2ABPFE(25T), Mitsui Chemicals, Inc., copper foil/polyimide layer/copper foil=12 μm/25 μm/12 μm thickness) so that the resin layers (protective films) were against the polyimide film. After laminating the assembly in vacuo at 130° C. and 3 MPa, the carrier film was peeled off, and the resin layer was cured at 185° C. for 60 minutes in a circulating hot air oven. In this way a test specimen was manufactured in which a 38 μm-thick insulating resin layer (circuit protective layer) was formed on both sides. Using the test specimen, flame retardancy was evaluated in accordance with "UL94 Thin Material Vertical Burning Test."

[Reflow Test]

A polyimide substrate having a comb-shaped copper circuit (copper foil thickness: 12 μm, L/S=35 μm/35 μm) was provided. A dry film was attached to the polyimide substrate so that the resin layer (protective film) was against the circuit surface of the polyimide substrate. After laminating the assembly in vacuo at 190° C. and 3 MPa, the carrier film was peeled off, and the resin layer was cured at 185° C. for 60 minutes in a circulating hot air oven. In this way an evaluation sample was manufactured in which a 10 μm-thick cover layer (circuit protective layer) was formed on the copper foil. The evaluation sample was attached to a reflow board (magic resin board, Daisho Denshi Co., Ltd.) so that the cover layer (circuit protective layer) was firmly attached to the reflow board. The reflow board to which the evaluation sample was attached was allowed to flow at a flow rate of 0.4 m/min in a reflow furnace (SX-1508, Senju Metal Industry Co., Ltd.) in which peak temperatures were set to 220° C. and 260° C. After separating the evaluation sample from the reflow board, a surface of the reflow board was observed at 25× under a microscope to confirm the presence or absence of any cover layer residue or contamination. When the presence of cover layer residue or contamination was confirmed on the reflow board surface, it was determined that an anomaly occurred. On the other hand, when the presence of cover layer residue or contamination was not confirmed on the reflow board surface, it was determined that an anomaly did not occur.

Synthesis Example 1

Pox1

75.0 g of methyl ethyl ketone (MEK), 37.0 g of isopropyl alcohol (IPA) and 37.0 g of toluene were charged into a 500 ml four-necked separable flask, and the reaction was heated to 70° C. A dropping funnel containing 40.0 g of toluene and 60.0 g of methylene diisocyanate (MDI-PH) (Mitsui Chemicals, Inc.) was placed onto the four-necked separable flask, and the content of the dropping funnel was added dropwise into the flask over about 30 minutes. After a 1-hour reaction at 80° C., the reaction was heated to 160° C. to remove IPA and toluene. After cooled, 40.0 g of dimethylacetamide (DMAc) and as a catalyst 0.6 g of 1-benzyl-2-phenylimidazole (1B2PZ) (Shikoku Chemical Corporation) were added and stirred, and the reaction mass was transferred to a dropping funnel.

The dropping funnel was placed onto a 1 L separable flask containing 160.0 g of DMAc and 90.0 g of bisphenol epoxy resin (EPOMIK R-139S, Mitsui Chemicals, Inc., epoxy equivalent weight: 185 g/eq). The mole ratio of the dicarbamate compound to the diepoxy compound (dicarbamate compound/diepoxy compound) was 1.04. The content in the dropping funnel was added in dropwise into the flask over about 40 minutes while heating the reaction to 160° C. under stirring and nitrogen stream. While distilling off IPA being produced, the reaction was continued for about 4 hours until removal IPA by distillation finishes. As a result, a 45 wt % polyoxazolidone (Pox1) solution in DMAc was prepared. The obtained polyoxazolidone (Pox1) was analyzed by infrared spectroscopy, confirming in the spectrum that an absorption at 915 cm$^{-1}$ ascribed to the epoxy group disappeared and an absorption at 1752 cm$^{-1}$ ascribed to the carbonyl group of the oxazolidone ring occurred. The weight-average molecular weight (Mw) of the obtained polyoxazolidone (Pox1) was 103,000.

Synthesis Example 2

Pox2

A 45 wt % polyoxazolidone (Pox2) solution in DMAc was prepared in the same manner as in Synthesis Example 1 except that while distilling off IPA being produced, the reaction was continued for about 8 hours until removal IPA by distillation finishes. The weight-average molecular weight (Mw) of the obtained polyoxazolidone was 146,000.

Synthesis Example 3

Pox3

A 45 wt % polyoxazolidone (Pox3) solution in DMAc was prepared in the same manner as in Synthesis Example 1 except that 98.0 g of the bisphenol epoxy resin (EPOMIK R-139S, Mitsui Chemicals, Inc., epoxy equivalent weight: 185 g/eq) was used and that the reaction was carried out with the mole ratio of the dicarbamate compound to the diepoxy compound (dicarbamate compound/diepoxy compound) being 0.95. The weight-average molecular weight (Mw) of the obtained polyoxazolidone was 112,000.

Synthesis Example 4

Pox4

A 45 wt % polyoxazolidone (Pox4) solution in DMAc was prepared in the same manner as in Synthesis Example 1 except that 71.0 g of the bisphenol epoxy resin (EPOMIK R-139S, Mitsui Chemicals, Inc., epoxy equivalent weight: 185 g/eq) was used and that the reaction was carried out with the mole ratio of the dicarbamate compound to the diepoxy compound (dicarbamate compound/diepoxy compound) being 1.30. The weight-average molecular weight (Mw) of the obtained polyoxazolidone was 27,000.

Synthesis Example 5

PHBAEP

A mixture of 46 g (0.10 mol) of tris-p-hydroxyphenyl-methane, 340 g of epichlorohydrin, and 0.65 g of ethyltriphenylphosphonium bromide was stirred at 105-110° C. for 2 hours. The content of the flask was cooled, followed by addition of 35 ml of toluene. The inner pressure of the flask was reduced to below 50 mmHg, and the flask was heated to 70-80° C. Thereafter, 31 g of 50 wt % sodium hydroxide aqueous solution was added drowpise into the flask, and distillation was continued for 60 minutes while circulating epichlorohydrin. The reaction mixture was cooled, and NaCl was removed by suction filtration. The epichlorohydrin solution was washed with water and condensed to dryness in vacuo to afford a trifunctional epoxy resin (PHBAEP) having a melting point of 60-65° C. and an epoxy equivalent weight of 166 g/eq.

Example 1

To 200 g of the 45 wt % polyoxazolidone (Pox1) solution in DMAc was added as a flame retardant 15 g of phenoxycyclophosphazene (FP-300, FUSHIMI Pharmaceutical Co., Ltd., P content: 1.40%) and 25 g of the trifunctional epoxy resin (PHBAEP, epoxy equivalent weight: 166 g/eq), and stirred in an automatic kneader for 30 minutes to afford a brown viscous liquid (varnish). The viscosity of the obtained varnish was 3.0 Pa's. The varnish was applied onto a 38 μm-thick PET film and dried to produce a dry film in which a 25 μm-thick resin layer was formed on the PET film. Using the dry film, base materials for flexural fatigue test, flame retardancy evaluation and reflow test were fabricated, and the evaluations were carried out. Results are listed in Table 1.

Examples 2-8, Comparative Example 1

Dry films were produced in the same manner as in Example 1 except that varnishes (resin compositions) having the compositions listed in Table 1 were prepared and used. Using the dry films, base materials for flexural fatigue test, flame retardancy evaluation and reflow test were fabricated, and the evaluations were carried out. Results are listed in Table 1.

mosetting resin (epoxy resin) having at least three reactive functional groups in one molecule was added (Examples 1-6), the state of the dry film improved, and moreover, flexural fatigue life improved. The addition of the flame retardant resulted in improvement of flame retardancy (Examples 1-6 and 8).

INDUSTRIAL APPLICABILITY

The resin composition of the present invention can provide a circuit board and a multilayer circuit board which are superior in heat resistance and flexural fatigue life. The resin composition of the present invention can also provide a dry film suitably used for the manufacture of such a circuit board and a multilayer circuit board.

REFERENCE SIGNS LIST

1 Substrate
2, 2' Circuit
3 Printed circuit board
10, 10' Protective film
11 Flexible support
20 Circuit board
21 Multilayer circuit board

The invention claimed is:
1. A protective film for circuit board to be disposed in contact with a circuit of a printed circuit board, the protective film comprising:
a polyoxazolidone resin (A) having a weight-average molecular weight of $3 \times 10^4$ or more, the polyoxazolidone resin (A) being obtained by a reaction of a dicarbamate compound represented by the following general formula (2):

$$R_5OOCHN-R_2-NHCOOR_5 \quad (2)$$

wherein:
$R_2$ is $C_{1-60}$ divalent organic group, and

TABLE 1

| | | | Examples | | | | | | | | Comparative Example |
|---|---|---|---|---|---|---|---|---|---|---|---|
| | | | 1 | 2 | 3 | 4 | 5 | 6 | 7 | 8 | 1 |
| Composition (parts by weight) | Pox1 | Mw: 103,000 | 200 | | | 200 | 200 | 200 | 200 | 200 | |
| | Pox2 | Mw: 146,000 | | 200 | | | | | | | |
| | Pox3 | Mw: 112,000 | | | 200 | | | | | | |
| | Pox4 | Mw: 27,000 | | | | | | | | | 200 |
| | FP-300 | | 15 | 15 | 15 | 7 | 45 | 20 | | 15 | 15 |
| | R-139S | | | | | | | | | 25 | |
| | PHBAEP | | 25 | 25 | 25 | 25 | 25 | 65 | | 25 | 25 |
| P content (wt %) | | | 1.4 | 1.4 | 1.4 | 0.7 | 3.4 | 1.4 | | 1.4 | 1.4 |
| Epoxy resin content (wt %) | | | 19.2 | 19.2 | 19.2 | 20.5 | 15.6 | 37.1 | | 19.2 | 19.2 |
| Evaluation Results | State of dry film | | A | A | A | A | A | A | B | A | C |
| | Number of flexural fatigue cycles | | 525600 | 620000 | 328000 | 414000 | 288000 | 376400 | 124500 | 38700 | 26200 |
| | Flame retardancy | | VTM-0 | VTM-0 | VTM-0 | VTM-0 | VTM-0 | VTM-0 | VTM-out | VTM-0 | VTM-0 |
| | Appearance after reflow | | No anomaly | No anomaly | No anomaly | No anomaly | No anomaly | No anomaly | No anomaly | No anomaly | Bulge occurred |

As seen from Table 1, the laminates and circuit boards manufactured using the resin compositions of Examples exhibited superior flexural fatigue life and reflow heat resistance. Moreover, as seen from Table 1, the dry films having the resin layers made of the resin compositions of Examples remained in film form without being broken into pieces even when the resin layer was laminated to a substrate and thereafter the carrier film was peeled off. In particular, when thereach $R_5$ is independently a $C_{1-12}$ alkyl group, a $C_{1-12}$ alkoxyalkyl group,
or a $C_{1-12}$ monovalent organic group represented by $R^a-(OR^b)m-$ (wherein $R^a$ is an alkyl group, $R^b$ is an alkylene group, and m is an integer of 1-11)
with a diepoxy compound represented by the following general formula (3):

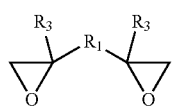

(3)

wherein:
$R_1$ is $C_{1-60}$ divalent organic group, and
each $R_3$ is independently hydrogen or $C_{1-6}$ hydrocarbon group; and
a thermosetting resin (C) having three or more reactive functional groups in one molecule thereof which is at least one member selected from the group consisting of an epoxy resin, a thermosetting polyimide and an acrylate compound, the content of thermosetting resin (C) in the resin composition being 10-50 mass %, based on the total mass of the polyoxazolidone resin (A) and the thermosetting resin (C).

2. The protective film according to claim 1, wherein the resin composition contains a flame retardant (B).

3. The protective film according to claim 1, wherein the polyoxazolidone resin (A) has a repeat unit represented by the following general formula (1):

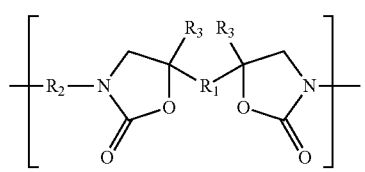

(1)

where $R_1$ and $R_2$ are independently $C_{1-60}$ divalent organic group, and each $R_3$ is independently hydrogen or $C_{1-6}$ hydrocarbon group.

4. A dry film comprising:
a flexible support; and
the protective film according to claim 1 disposed on the flexible support.

5. A circuit protective layer in a printed circuit board, wherein the circuit protective layer is made of a cured product of the protective layer according to claim 1.

6. A circuit board comprising:
a printed circuit board including a substrate and a circuit formed on the substrate; and
a cured product of the protective film according to claim 1, the cured product being laminated onto the printed circuit board so as to be in contact with the circuit.

7. The circuit board according to claim 6, wherein the circuit board is a flexible circuit board.

8. A multilayer circuit board comprising:
two or more printed circuit boards laminated together, each including a substrate and a circuit formed on the substrate; and
a cured product of the protective film according to claim 1 disposed between a pair of the printed circuit boards.

9. The multilayer circuit board according to claim 8, wherein the multilayer circuit board is a flexible multilayer circuit board.

10. A resin composition comprising:
a polyoxazolidone resin (A) having a weight-average molecular weight of $3 \times 10^4$ or more, the polyoxazolidone resin (A) being obtained by a reaction of a dicarbamate compound represented by the following general formula (2):

$$R_5OOCHN-R_2-NHCOOR_5 \quad (2)$$

wherein:
$R_2$ is $C_{1-60}$ divalent organic group, and
each $R_5$ is independently a $C_{1-12}$ alkyl group, a $C_{1-12}$ alkoxyalkyl group,
or a $C_{1-12}$ monovalent organic group represented by $R^a-(OR^b)m-$ (wherein $R^a$ is an alkyl group, $R^b$ is an alkylene group, and m is an integer of 1-11)
with a diepoxy compound represented by the following general formula (3):

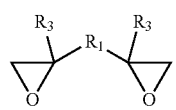

(3)

wherein:
$R_1$ is $C_{1-60}$ divalent organic group, and
each $R_3$ is independently hydrogen or $C_{1-6}$ hydrocarbon group; and
a thermosetting resin (C) having three or more reactive functional groups in one molecule thereof which is at least one member selected from the group consisting of an epoxy resin, a thermosetting polyimide and an acrylate compound, the content of thermosetting resin (C) in the resin composition being 10-50 mass %, based on the total mass of the polyoxazolidone resin (A) and the thermosetting resin (C).

11. The resin composition according to claim 10, further comprising a flame retardant (B).

12. The resin composition according to claim 10, wherein the polyoxazolidone resin (A) has a repeat unit represented by the following general formula (1):

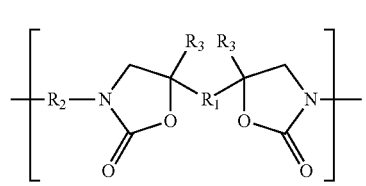

(1)

where $R_1$ and $R_2$ are independently $C_{1-60}$ divalent organic group, and each $R_3$ is independently hydrogen or $C_{1-6}$ hydrocarbon group.

13. A method of manufacturing a circuit board, the circuit including: a printed circuit board that includes a substrate and a circuit disposed on the substrate; and a circuit protective layer laminated to the printed circuit board so as to be in contact with the circuit, the method comprising:
providing the printed circuit board;
disposing the protective film according to claim 1 on the circuit of the printed circuit board followed by vacuum lamination; and
thermally curing the protective film to form the circuit protective layer.

* * * * *